(12) United States Patent
Habiboglu et al.

(10) Patent No.: US 12,096,698 B2
(45) Date of Patent: Sep. 17, 2024

(54) MAGNETIC TUNNELING JUNCTIONS WITH A MAGNETIC BARRIER

(71) Applicant: ARIZONA BOARD OF REGENTS ON BEHALF OF THE UNIVERSITY OF ARIZONA, Tucson, AZ (US)

(72) Inventors: Ali Habiboglu, Tucson, AZ (US); Yihong Cheng, Tucson, AZ (US); Shufeng Zhang, Tucson, AZ (US); Weigang Wang, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 18/462,887

(22) Filed: Sep. 7, 2023

(65) Prior Publication Data

US 2023/0422631 A1    Dec. 28, 2023

Related U.S. Application Data

(62) Division of application No. 17/051,680, filed as application No. PCT/US2019/030932 on May 6, 2019, now Pat. No. 11,793,086.

(60) Provisional application No. 62/812,809, filed on Mar. 1, 2019, provisional application No. 62/667,380, filed on May 4, 2018.

(51) Int. Cl.
*H10N 50/80* (2023.01)
*H10B 61/00* (2023.01)
*H10N 50/85* (2023.01)

(52) U.S. Cl.
CPC .............. *H10N 50/80* (2023.02); *H10B 61/00* (2023.02); *H10N 50/85* (2023.02)

(58) Field of Classification Search
CPC ......... H10N 50/80; H10N 50/85; H10B 61/00
See application file for complete search history.

(56) References Cited

U.S. PATENT DOCUMENTS

| | | |
|---|---|---|
| 2006/0291105 A1 | 12/2006 | Chang et al. |
| 2010/0258849 A1 | 10/2010 | Worledge |
| 2012/0069648 A1 | 3/2012 | Kramer et al. |
| 2015/0243414 A1 | 8/2015 | Binek et al. |
| 2015/0303372 A1 | 10/2015 | Meade et al. |

(Continued)

OTHER PUBLICATIONS

T. R. McGuire, E. J. Scott, and F. H. Grannis, Antiferromagnetism in a Cr2O3 Crystal, Phys. Rev. 102, 1000 (Year: 1956).*

(Continued)

*Primary Examiner* — Shih Tsun A Chou
(74) *Attorney, Agent, or Firm* — NGUYEN TARBET IP LAW

(57) ABSTRACT

Advanced magnetic tunneling junctions (MTJs) that dramatically reduce power consumption (switching energy, $E_{SW}$) while maintaining a reasonably high tunneling magnetoresistance (on/off ratio, TMR) and strong thermal stability at room temperature are described herein. The MTJs include a magnetic insulator, such as an antiferromagnetic material, as the tunnel barrier. A more energy efficient switching in the MTJs is achieved by magnon assisted switching.

19 Claims, 4 Drawing Sheets

(56) References Cited

U.S. PATENT DOCUMENTS

| | | | |
|---|---|---|---|
| 2016/0284761 A1* | 9/2016 | Zhou | H01L 23/552 |
| 2017/0098761 A1 | 4/2017 | Worledge | |
| 2017/0352802 A1 | 12/2017 | Nikonov et al. | |
| 2018/0006085 A1 | 1/2018 | Chuang et al. | |
| 2018/0090674 A1 | 3/2018 | Wang et al. | |

OTHER PUBLICATIONS

Zhang, S., Levy, P.M. Magnetoresistance of Magnetically Uncoupled Multilayered Structures. MRS Online Proceedings Library 231, 255-260 (1991) (Year: 1991).*

Vopson, Melvin M. "Fundamentals of multiferroic materials and their possible applications." Critical Reviews in Solid State and Materials Sciences 40.4 (2015): 223-250.

Shiratsuchi et al. "Superparamagnetism of ultrathin Co film on antiferromagnetic Cr2O3 layer." Journal of Physics: Conference Series. vol. 165. No. 1. IOP Publishing, 2009.

Tunnel magnetoresistance https://en.wikipedia.org/wiki/Tunnel_magnetoresistance retrieved from web Nov. 6, 2023.

Pati et al. "Finite-size scaling effect on Neel temperature of antiferromagnetic Cr2O3 (0001) films in exchange-coupled heterostructures." Physical Review B 94.22 (2016): 224417.

* cited by examiner

MAGNETIC TUNNELING JUNCTIONS WITH A MAGNETIC BARRIER

CROSS-REFERENCES TO RELATED APPLICATIONS

This application is a divisional and claims benefit of U.S. application Ser. No. 17/051,680 filed Oct. 29, 2020, which is a 371 and claims benefit of PCT/US2019/030932 filed May 6, 2019, which claims benefit of U.S. Patent Application No. 62/667,380 filed May 4, 2018 and U.S. Patent Application No. 62/812,809 filed Mar. 1, 2019, the specification(s) of which is/are incorporated herein in their entirety by reference.

STATEMENT REGARDING FEDERALLY SPONSORED RESEARCH OR DEVELOPMENT

This invention was made with government support under Grant Nos. 1554011 and 1708180, awarded by NSF. The government has certain rights in the invention.

BACKGROUND OF THE INVENTION

Field of the Invention

The present invention relates to tunneling junctions with a magnetic insulator as a tunnel barrier.

Background Art

New developments in the information age, such as big data, artificial intelligence, internet of things (IoT) and 5G wireless communications, directly rely on the continuous increase of computation power and expansion of information technology infrastructure. Recent studies predict that the global electricity usage of information & communication technology (computers, data-centers, wireless network etc.) will more than double in the next decade, which could account for 15% of total electricity produced. The dramatic increase of power consumption in part stems from a perennial demand for greater computation performance and increased stand-by power dissipation of all complementary metal-oxide semiconductor transistors when gate size is reduced to a few nanometers.

Spintronics represents a promising solution to address the problem of greatly increased power consumption in CMOS transistors for memory and logic applications. Storing information as spin, instead of charge, spintronics offers a unique route to eliminate energy waste in the stand-by state. A large part of the present spintronics research focuses on reducing the dynamic power consumption (switching energy, $E_{SW}$) and increasing the on/off ratio (magnetoresistance) in various structures. Magnetic tunnel junctions (MTJs) have been arguably the most important building blocks in spintronic technology. In most cases, the active part of a spintronic device is made of ferromagnetic (FM) materials forming an FM layer in the MTJ. Since the discovery of large tunnel magnetoresistance (TMR) in MgO-based MTJs, research and development on MTJs have almost exclusively focused on MgO barriers. Indeed, MgO tunnel barriers have shown tremendous advantages over other insulating barriers such as amorphous $Al_2O_3$. As known to one of ordinary skill in the art, the TMR is defined by: TMR=$(R_{AP}-R_P)/R_P$, where $R_P$ and $R_{AP}$ are the resistance of the MTJ in parallel and antiparallel configuration. The superior epitaxial growth of a MgO barrier with transition metal ferromagnet electrodes makes the tunnel resistance rather tunable to meet the different requirement of specific devices, e.g., magnetic reading heads and magnetic random access memories (MRAMs). Most importantly, the TMR of MgO-based MTJs is as large as 600% at room temperature, far exceeding other known tunnel barriers.

While the large TMR value of MgO-based MTJs provides unprecedented efficiency for magnetic reading, switching the magnetization direction of MTJs for writing remains challenging. In the first generation of MRAM devices, an external magnetic field is used for magnetization switching; this method is not scalable and would fail for high density MRAMs. The second generation takes advantage of spin-transfer torques (STTs) where a sufficient large electric current across the tunnel barrier can reorient the relative magnetizations of two magnetic layers in parallel or antiparallel, depending on the polarity of the current. Up until now, the critical switching current density ($j_c$) for STT is very high, on the order of $10^6$ A cm$^{-2}$. In STT switching, the spin angular momentum of tunnel electrons from one electrode to the other determines the total magnetic torque. Under a typical switching voltage across the junction of about 0.5 V, each tunneling electron transfers its spin angular momentum at a maximum of $\hbar/2$, where $\hbar$ is Planck's constant, but the accompanied energy of 0.5 eV is completely wasted. Thus, the STT switching by tunnel electrons are not energy efficient. Hence, there exists a need for a completely different MTJ in which energy efficiency of STT switching is improved.

One alternative for STT switching is based on spin-orbit torques (SOTs). Instead of applying a switching current across the tunnel barrier, an in-plane current is applied to a heavy metal (HM) layer next to the free FM layer. In the presence of the spin orbit coupling in the HM and at the interface, the perpendicular spin currents provide the angular momentum needed for the magnetization switching. While the above spin orbit torque is energetically favorable in theory (compared to the direct STT torque) and multiple MTJs on a single HM wire can be switched, the switching current remains large, of the order of $10^6$-$10^7$/cm$^2$ as well.

During the early stage of MTJ development, a Ni/NiO/Co junction was reported to have small TMR at low temperature. When the $Al_2O_3$-based MTJ with more than 10% room temperature TMR was discovered in 1995, many experimental groups were racing to find better MTJs with a larger TMR value. After the MgO-based MTJs were discovered in 2004, the search for new tunnel junctions was no longer of interest. Research effort has been focused on optimizing MgO-based MTJs which became a standard material choice for all spintronics applications. This present invention focuses on a different MTJ in which the barrier is an antiferromagnetic material.

BRIEF SUMMARY OF THE INVENTION

It is an objective of the present invention to provide magnetic tunnel junctions (MTJs) with a magnetic insulator as a tunnel barrier, as specified in the independent claims. It is a further objective of the present invention to provide MTJs with reduced $E_{sw}$ while maintaining a large tunneling magnetoresistance (TMR) and strong thermal stability at RT. Embodiments of the invention are given in the dependent claims. Embodiments of the present invention can be freely combined with each other if they are not mutually exclusive.

According to some aspects, the present invention features a tunnel junction comprising a first ferromagnetic layer, a second ferromagnetic layer, and a tunnel barrier juxtaposed between the first ferromagnetic layer and the second ferromagnetic layer. In one embodiment, the first ferromagnetic layer can have a fixed magnetization and the second ferromagnetic layer can have a free magnetization. Preferably, the tunnel barrier comprises a magnetic insulator layer that is magnetically uncoupled to the free second ferromagnetic layer. In some embodiments, the magnetic order of the tunnel barrier can be of antiferromagnetic, ferrimagnetic, paramagnetic, or ferromagnetic nature.

For demonstration purposes, a non-limiting example of an antiferromagnetic insulator (AFI) will be described herein. Antiferromagnets can have a number of advantages compared with their FM counterparts. For instance, the AF material have no net magnetization therefore AF cells can be packed into extremely high density without affecting each other; and for the same reason, they are immune to external magnetic fields. Also, due to the staggered arrangement of spins in AFs, the spin currents can penetrate much deeper into AFs. Furthermore, the magnetization switching frequency of AFs can be as high as THz, promising ultra-high speed and ultra-low energy operations.

In some embodiments, the present invention features a two-terminal AF-MTJ with a magnetoelectric (ME) $Cr_2O_3$ barrier. In other embodiments, the present invention utilizes other transitional metal oxides as an AFI replacing MgO as the tunnel barrier. Without wishing to limit the invention to any theory or mechanism, it is believed an AFI-based MTJ could significantly reduce the critical switching current density compared to nonmagnetic barrier-based MTJ, particularly, the MgO-based MTJ. In preferred embodiments, the MTJs of the present invention features an AFI barrier that displays a large tunnel magnetoresistance (TMR) and other technologically friendly parameters such as tunable magnetic anisotropy, favorable temperature and bias dependence of TMR, and high transparency for magnons to propagate across.

In one embodiment, the low energy switching can be achieved by the magnetoelectric effect. Due to a roughness-insensitive surface magnetization and a strong ME effect in oxides such as $Cr_2O_3$, the direction of exchange bias (EB) to the free FM layer of the MTJ can be isothermally switched by a small electric field applied across the insulator, which allows for manipulation of the magnetization of FM with small energy. In another embodiment, the low energy switching can be achieved by magnon assisted switching. When a finite voltage bias is applied to the MTJ, the energy relaxation of the tunnel electrons leads to asymmetric heating of two metallic layers. Consequently, there is magnon current flowing across the magnetic insulator layer, resulting in a magnon transfer torque in addition to the electron spin-transfer torque. Compared to a tunnel junction with a nonmagnetic insulator with negligible magnon transmission, the magnon transfer torque with a tunnel barrier having magnetic order could be many times larger than the conventional spin-transfer torque of the tunnel electrons. This can provide a more energy efficient switching in tunnel junctions.

In some embodiments, the tunnel junctions described herein may be used for information storage applications, stand-alone memories, logic units and oscillators. In other aspects, the tunnels junctions are suitable for use in other spintronic devices such as lateral spin valves and neuromorphic processors for deep learning, as well as for emergent technologies such as wearable computers and Internet of Things, where the nonvolatile feature of spintronics is highly appreciated.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

Figure 2:
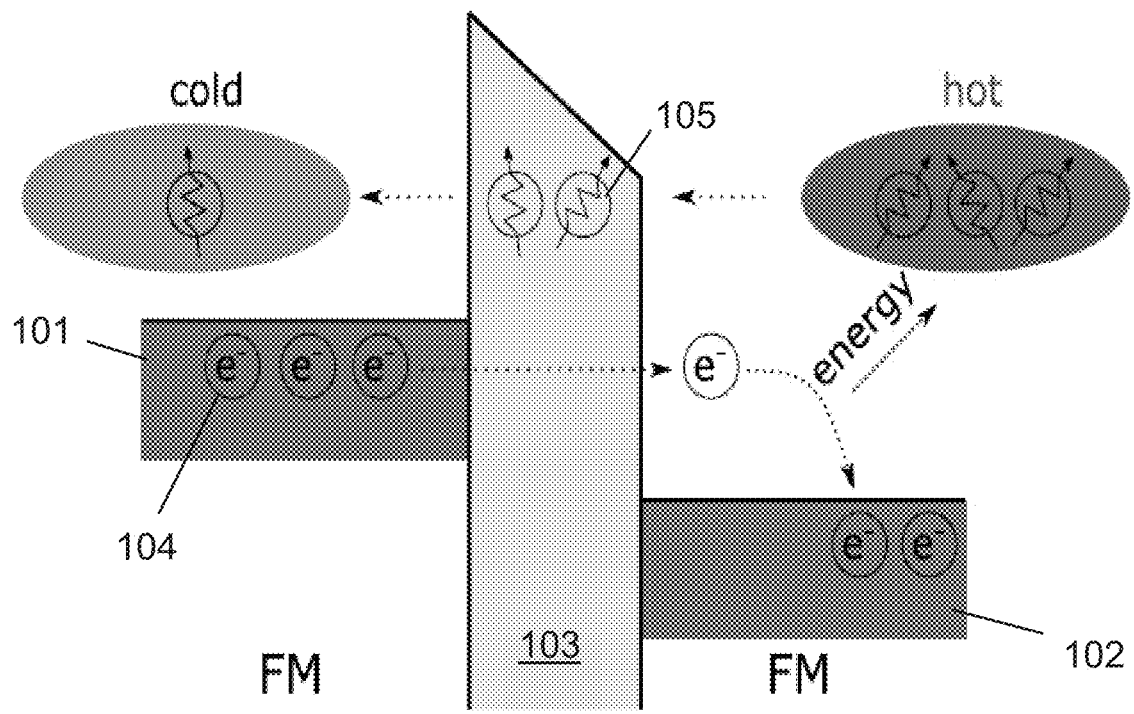

FIG. 2 shows a non-limiting schematic of electrons in the AFI-MTJ. Two FM layers are separated by an AFI barrier and they are biased by a negative voltage about 0.2-2V. Hot electrons tunnel from the left FM electrode to the right FM electrode and the excess energy is dissipated over inelastic scattering length to heat up magnons on the right. The resulting magnons would diffuse from right (hot) to left (cold) mediated by the magnons in AFI.

Figure 3A:
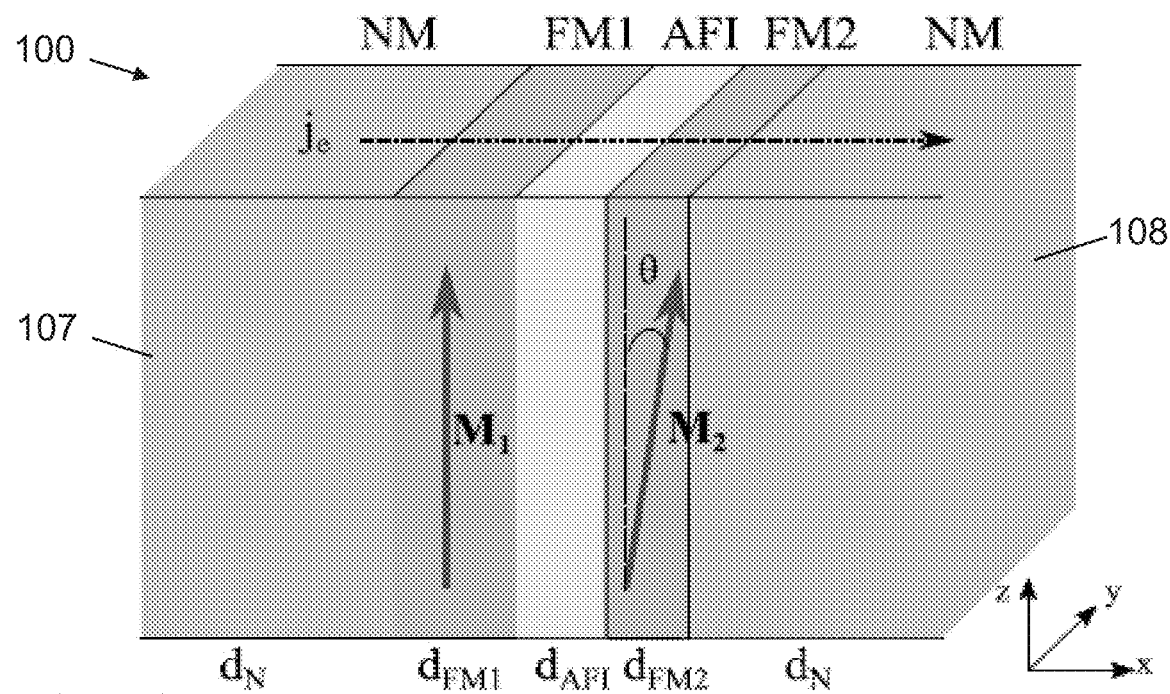

FIG. 3A illustrates a non-limiting embodiment of the AFI-MTJ structure.

Figure 3B:
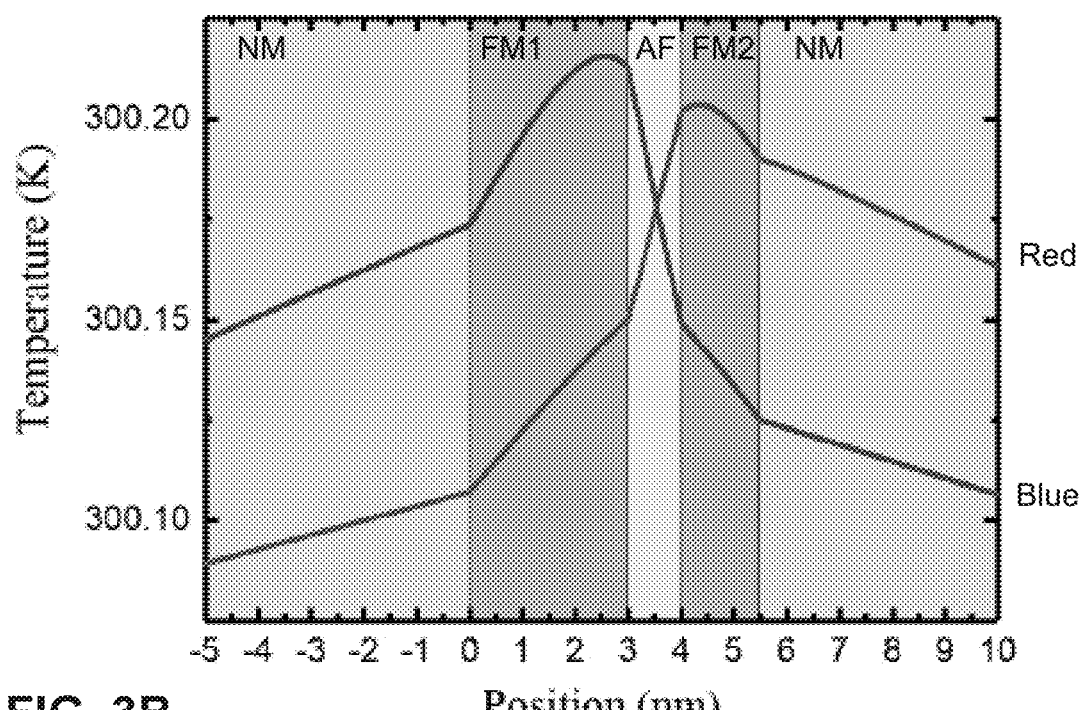

FIG. 3B shows temperature profiles for both directions of the current in the AFI-MTJ structure. The red solid line denotes electrons tunnel from left to right, and the blue solid line denotes electrons tunnel from right to left.

Figure 4:
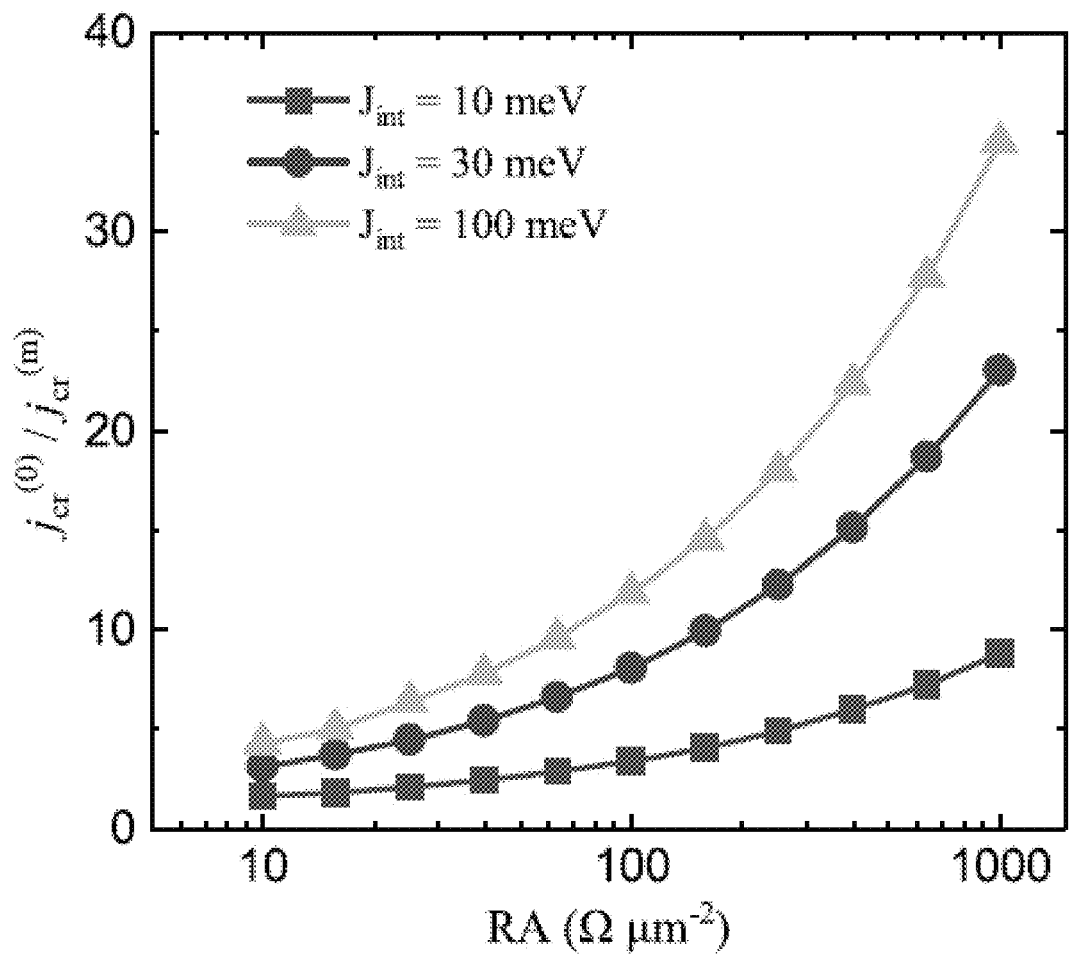

FIG. 4 shows the dependence of the ratio of the switching current density with and without the magnon spin torques on tunnel resistance area product (RA) at different interface exchange coupling strength.

Figure 5A:
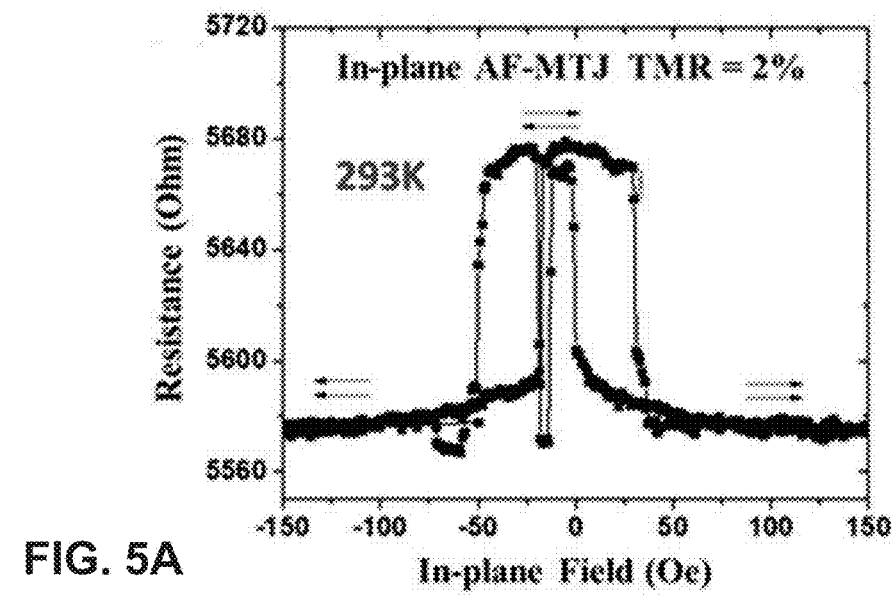
Figure 5B:
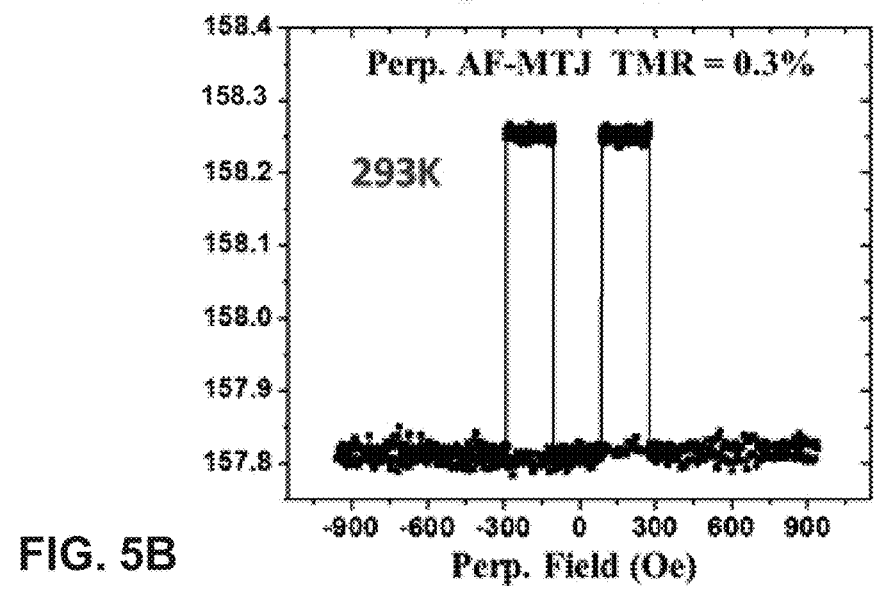
Figure 5C:
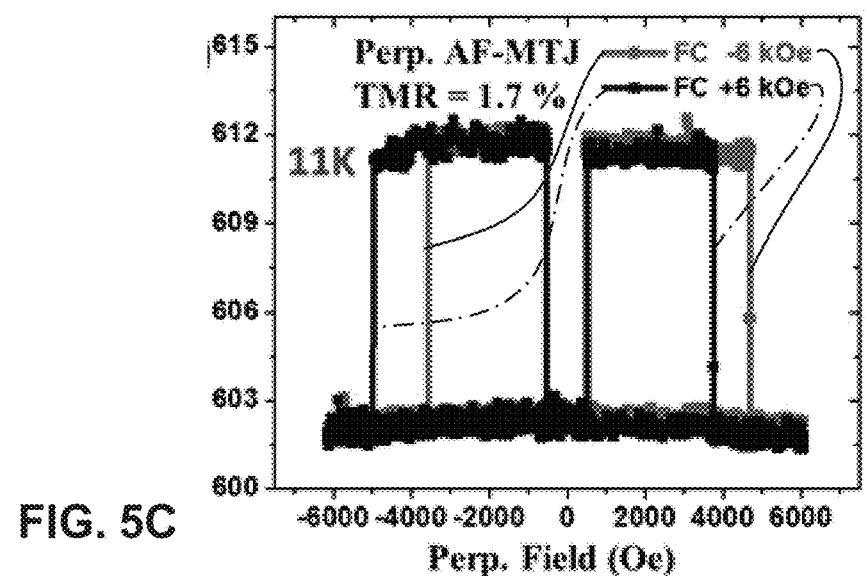

FIG. 5A shows a room temperature TMR curve for a $Cr_2O_3$-MTJ with in-plane magnetic anisotropy. FIG. 5B is a room temperature TMR curve for a $Cr_2O_3$-MTJ with perpendicular magnetic anisotropy (PMA). FIG. 5C shows a low temperature TMR curve for the AF-MTJ shown in FIG. 5B. The exchange bias effect to the hard FM layer is fully controlled by the direction of magnetic field applied during cooling.

DETAILED DESCRIPTION OF THE INVENTION

Following is a list of elements corresponding to a particular element referred to herein:
100: tunneling junction
101, 102: ferromagnetic layer
103: tunnel barrier
104: electrons
105: magnons
107, 108: nonmagnetic layer As used herein, the term "ferromagnetic" (FM) refers to a magnetic ordering of a material wherein the spins within the magnetic domain of a material having the same orientation, e.g. aligned in parallel (↑↑). As used herein, the term "antiferromagnetic" (AF) refers to a magnetic ordering of a material wherein neighboring spins have opposing orientations, e.g. aligned in antiparallel (↑↓), and the magnetic moments of the neighbors are equal, thus the net moment is zero. As used herein, the term "ferrimagnetic" is another type of magnetic ordering similar to antiferromagnetic except the magnetic moments of the neighbors are not equal, thus resulting in a net moment (↑↓). As used herein, the term "paramagnetic" is defined as a magnetic ordering of a material characterized by having a magnetization caused by the realignment of magnetic moments of unpaired electrons due to the presence of an external magnetic field. When the external magnetic field is removed, the magnetization is zero.

As known to one of ordinary skill in the art, the Neel temperature, $T_N$, is the temperature above which an antiferromagnetic material becomes paramagnetic. In other words, the thermal energy becomes large enough such that the material behaves paramagnetically with the magnetic moments aligned with the applied magnetic field direction therefore enhancing the overall magnetization of the material.

Figure 1A:
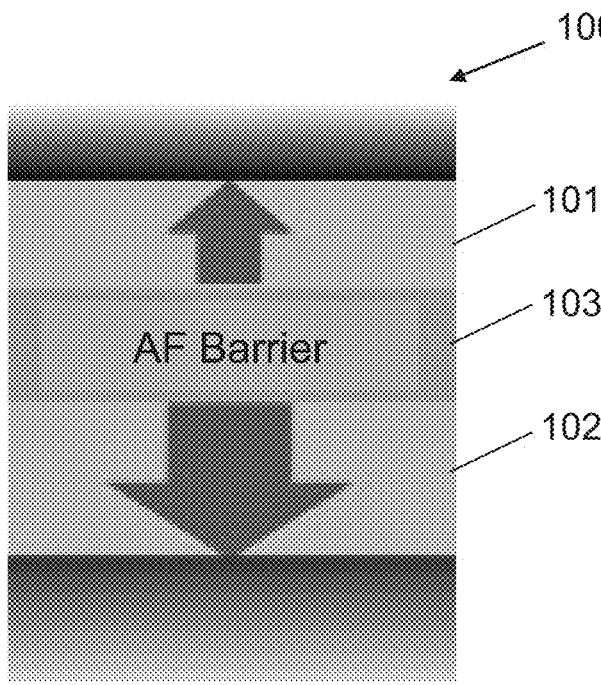
FIG. 1A is a non-limiting embodiment of a 2-terminal, 2-level structure of an antiferromagnetic magnetic tunneling junction (AFI-MTJ) of the present invention.

Referring to FIG. 1A, in one embodiment, the present invention features a magnetic tunneling junction (MTJ) (100) comprising a first ferromagnetic layer (101), a second ferromagnetic layer (102), and an antiferromagnetic layer (103) disposed between the first and second ferromagnetic layers (101, 102). In some embodiments, the first and second ferromagnetic layers (101, 102) comprise CoFeB. In other embodiments, the antiferromagnetic layer (103) may comprise a magnetoelectric (ME) material that provides a switching of exchange bias (EB). For example, the antiferromagnetic layer (103) is $Cr_2O_3$, such as epitaxial $Cr_2O_3$. In yet other embodiments, the antiferromagnetic layer (103) may be doped with materials to enhance the AF ordering temperature, such as B or Al for example. The antiferromagnetic layer (103) may be treated with post-growth thermal annealing.

In some embodiments, the antiferromagnetic layer (103) is a tunnel barrier that provides tunneling magnetoresistance (TMR). When an electric field is applied across the antiferromagnetic layer (103), a direction of EB to the first or second ferromagnetic layer is switched, thereby manipulating the magnetization of the first and second ferromagnetic layers (101, 102). In one embodiment, the antiferromagnetic layer (103) can have a thickness of about 0.8 nm to about 3.5 nm. In another embodiment, the first and second ferromagnetic layers (101, 102) may each have a thickness greater than 2 nm and the MTJ (100) exhibits an in-plane magnetic anisotropy. In yet another embodiment, the first and second ferromagnetic layers (101, 102) may each have a thickness of about 1 nm and the MTJ (100) exhibits a perpendicular magnetic anisotropy.

Due to a roughness-insensitive surface magnetization and a strong ME effect of $Cr_2O_3$, the direction of exchange bias (EB) to an FM layer can be isothermally switched by a small electric field (EF) applied across the insulator, which allows for manipulation of the magnetization of FM with ultra-low energy. A net magnetization ($\delta M$) can be developed in the entire volume of the film if the material is an insulator with a strong ME coupling. The $\delta M$ in $Cr_2O_3$ is strongly coupled to the AF order parameter and its sign is controlled by the polarity of EF. Therefore under a constant magnetic field, the order parameter of the $Cr_2O_3$ can be switched by the applied EF, leading to the reversal of the uncompensated surface magnetization, which subsequently switches the EB direction of the pinned FM. In some embodiments, the free layer of the MTJ can be switched by voltage applied to the $Cr_2O_3$. Due to the small EF required to switch the AF order parameter, a much smaller $E_{SW}$ is needed as compared to other methods.

Figure 1B:
FIG. 1B is an example of a conventional 3-terminal, 3-level structure in the prior arts.

In the prior art, the lack of ultralow energy switching of resistance may be partly due to a 3-terminal, 3-level geometry in previous designs of magnetoelectric MTJs, as shown in FIG. 1B, where the MTJ is grown on top of (or below) a $Cr_2O_3$ layer. Two oxides are involved, one as the ME insulator to switch the direction of exchange bias (EB) and the other as the tunnel barrier. Two different voltage sources are required to connect to the 3-level structure, one for ME switching and one for TMR reading, respectively. This approach has not yielded any successful result of voltage controlled MTJ, due to the difficulties in fabricating a MTJ on top of the $Cr_2O_3$ and the challenges in 3-terminal, 3-level structures.

Instead of one ME oxide and one conventional tunnel barrier, some embodiments of the MTJ of the present invention utilizes a single $Cr_2O_3$ layer as both tunnel barrier (providing TMR) and ME oxide (providing the switching of EB). In a non-limiting example, of an in-plane MTJs, a robust TMR has been successfully obtained at RT, as shown in FIG. 5A. The $Cr_2O_3$ thickness of this particular MTJ is 3 nm. In MTJs with perpendicular magnetic anisotropy (PMA), a clear TMR curve at RT was obtained as shown in FIG. 5B. The sharp transition of switching is characteristic of a sample with PMA. More importantly, the $Cr_2O_3$ maintained the AF order at low temperature even at the small thickness of ~3 nm. An exchange bias effect to the magnetic hard layer can be seen in FIG. 5C. The direction of the EB is fully controlled by the orientation of the magnetic field during cooling. The blocking temperature was found to be around 50K. The TMR at 11K is nearly 5 times larger than that of RT. This demonstrates that the AF order of the barrier does not destroy TMR.

Without wishing to limit the present invention to a particular theory or mechanism, the results presented in FIGS. 5A and 5B demonstrates room temperature $Cr_2O_3$-MTJs with in-plane anisotropy and perpendicular anisotropy, respectively. More importantly, the antiferromagnetic nature of the $Cr_2O_3$ is directly revealed by the EB effect shown in FIG. 5C. To best of the inventors' knowledge, no TMR has been achieved at RT in MTJs with $Cr_2O_3$ barrier, nor any other AF oxide barrier where EB of the FM layer has been observed in $Cr_2O_3$-MTJs.

Again, without wishing to limit the present invention, it is believed that the TMR can be increased substantially by improving the dielectric properties of the $Cr_2O_3$ barrier. This may be achieved by using a fabrication method that grows a pinhole free, high density $Cr_2O_3$ barrier with low roughness to increase the resistance of the barrier. In other embodiments, the present invention utilizes a fabrication method that grows the MTJ with epitaxial $Cr_2O_3$ to substantially increase TMR, which substantially increases with epitaxial $Cr_2O_3$. For instance, ultra-thin $Cr_2O_3$ (0001) films can be grown on Co using a structure such as Co(0001)/$Cr_2O_3$(0001)/Co(0001), where the lattice mismatch between Co and $Cr_2O_3$ is less than 2% ($2a_{Co}$=0.501 nm, $a_{Cr2O3}$=0.495 nm).

In some other embodiments, the $Cr_2O_3$ barriers may be fabricated with Neel temperature ($T_N$) above RT by doping the barrier. The $T_N$ of bulk $Cr_2O_3$ is 307K, which reduces in thin film samples. For the ME-controlled MTJs, a barrier thickness in the range of 1-2 nm is desired in some embodiments. Therefore, the $T_N$ of $Cr_2O_3$ thin films must be increased to well above 300K. In a non-limiting example of a $Cr_2O_3$-MTJ, the $T_N$ may be increased to above 300K, for example, to at least 400K, with B or Al doping in $Cr_2O_3$. In some embodiments, the amount of B, or Al doping may range from about 1% to about 5%. For instance, the amount of doping ranges from about 2% to 3%.

In a non-limiting embodiment, the FM layers of the AF-MTJ were selected to comprise CoFeB so that the Boron in the CoFeB alloy diffuses out the FM layer during post-growth thermal annealing. As an example, the CoFeB composition may be $Co_{20}Fe_{60}B_{20}$ for both FM layers. Without wishing to be bound by a particular mechanism, the crystallization of amorphous CoFeB during thermal annealing diffuses out B atoms which are absorbed by both the tunnel barrier and the heavy metal layer adjacent to the CoFeB layer. In some embodiments, the $T_N$ may be increased substantially with further annealing. Both the annealing temperature and annealing time can be precisely tuned in a rapid thermal anneal procedure to achieve optimal doping of B in the $Cr_2O_3$ barrier. In other embodiments, doping with Al may also substantially enhance the blocking temperature as well as the unidirectional anisotropy energy of $Cr_2O_3$. In a non-limiting example, the Al doped $Cr_2O_3$ can be fabricated by co-sputtering of $Cr_2O_3$ and Al. In yet other embodiments, $Cr_2O_3$ may be doped with Fe.

According to some embodiments, the present invention features a tunneling junction (100) comprising a first ferromagnetic layer (101) having a fixed magnetization, a second ferromagnetic layer (102) having a free magnetization, and a tunnel barrier (103) disposed between the first and second ferromagnetic layers (101, 102). In a preferred embodiment, the tunnel barrier (103) comprises an insulator layer having a magnetic order. The insulator layer is magnetically uncoupled to the free second ferromagnetic layer (102).

Referring to FIG. 2, when an electric field having a low voltage at the first ferromagnetic layer (101) and a high voltage at the second ferromagnetic layer (102) is applied across the tunnel barrier (103), electrons (104) tunnel from the first ferromagnetic layer to the second ferromagnetic layer. The electrons have a spin that carries angular momentum, which generates a torque on the second ferromagnetic layer. The tunneling of the electrons generates heat in the second ferromagnetic layer. The heat generates a thermal gradient across the tunnel barrier (103) and excites magnons (105) that carry angular momentum. The angular momentum carried by the magnons is opposite in sign to the angular momentum of the tunneling electrons. Since the tunneling barrier (103) comprises the insulator layer with magnetic order, the thermal gradient causes a magnon current to flow across the tunnel barrier (103) from the second ferromagnetic layer (102) to the first ferromagnetic layer (101). Since the magnon current carries momentum of the opposite sign, the magnon current transfers angular momentum having the same sign as the tunnel current to the second ferromagnetic layer (102). Thus, the angular momentum can change a magnetization direction of the second ferromagnetic layer (102).

In some embodiments, the magnetic order of the insulator layer can be antiferromagnetic, ferrimagnetic, ferromagnetic, or paramagnetic. In one embodiment, the insulator layer may comprise an antiferromagnetic material such as $Cr_2O_3$, NiO, FeO, CoO, $BiFeO_3$, $SrIrO_4$, or other antiferromagnetic materials. In another embodiment, the insulator layer may comprise a ferromagnetic material such as Fe, Co, Ni, $Fe_3O_4$, Sr-doped lanthanum manganite perovskites ($La_{1-x}Sr_xMnO_3$, where x=0, 0.1, 0.15, 0.2, 0.3), Yttrium iron garnet (YIG), or other ferromagnetic materials or other transition metal oxides. In yet another embodiment, the insulator layer may comprise a ferrimagnetic material such as ferrites, magnetic garnets, or magnetite.

In some other embodiments, the insulator layer may comprise a material that is antiferromagnetic below the Neel temperature and paramagnetic above the Neel temperature, such as $LaMnO_3$ or $CaMnO_3$. In other embodiments, the insulator layer may comprise a material that is ferromagnetic below the Curie temperature and paramagnetic above the Curie temperature. For example, the insulator layer may comprise $LaCoMnO_3$, $LaSrMnO_3$, where the La concentration is ⅔ and the Co or Sr concentration is ⅓.

In some embodiments, the first ferromagnetic layer (101) may comprise Fe, Co, Ni, $Fe_3O_4$, Sr-doped lanthanum manganite perovskites ($La_{1-x}Sr_xMnO_3$, where x=0, 0.1, 0.15, 0.2, 0.3), Yttrium iron garnet (YIG), or other ferromagnetic materials. The Sr-doped lanthanum manganite perovskites may be according to $La_{1-x}Sr_xMnO_3$, where x ranges from 0-1. For example, x=0, 0.1, 0.15, 0.2, 0.3. In other embodiments, the first ferromagnetic layer (101) may comprise a combination of ferromagnetic materials and nonmagnetic materials, such as alloys of $Co_xFe_yB_z$, wherein x ranges from 0-95, y ranges from 0-95, and z ranges from 0-60.

In one embodiment, the second ferromagnetic layer (102) may comprise Fe, Co, Ni, $Fe_3O_4$, Sr-doped lanthanum manganite perovskites ($La_{1-x}Sr_xMnO_3$, wherein x ranges from 0-1), Yttrium iron garnet (YIG), or other ferromagnetic materials. In another embodiment, the second ferromagnetic layer (102) may comprise a combination of ferromagnetic materials and nonmagnetic materials, such as alloys of $Co_xFe_yB_z$, wherein x ranges from 0-95, y ranges from 0-95, and z ranges from 0-60.

In further embodiments, the tunneling junction (100) may include a first nonmagnetic layer (107) interfacing with one of the ferromagnetic layers. The tunnel junction (100) may further comprise a second nonmagnetic layer (108) interfacing with the other ferromagnetic layer such that the first ferromagnetic layer (101), the second ferromagnetic layer (102), and the tunnel barrier (103) are juxtaposed between the first nonmagnetic layer (107) and the second nonmagnetic layer (108). Examples of the nonmagnetic materials making up the nonmagnetic layers include, but are not limited to, Ru, Ta, Mo, W, Pt, Zr, Hf, oxides, nitrides, and combinations thereof.

According to some embodiments, the present invention features a non-volatile, magnetoresistive storage device comprising a non-volatile magnetoresistive storage element. The storage element may comprise any of the tunneling junctions described herein.

According to other embodiments, the present invention features a spintronic device comprising any of the tunneling junctions described herein. Spintronics, or spin electronics, focuses on electron spin, instead of charge, for information processing and storage in solid state devices. Information can be stored into spin as one of two possible orientations. Spintronic devices can combine logic and storage functionality, thereby eliminating the need for separate components. Spintronics can be used in MRAM applications and semiconductor transistors for memory and logic applications. Non-limiting examples of spintronic devices include magnetic hard disk drives, random access memories, spin logic cells, sensors, microwave oscillators, and amplifiers.

EXAMPLE

The following is a non-limiting example of the present invention, specifically, a magnetic tunneling junction with an antiferromagnetic insulator. It is to be understood that said example is not intended to limit the present invention in any way. Equivalents or substitutes are within the scope of the present invention.

It is an objective of the invention to provide an MTJ with an AFI replacing MgO as the tunnel barrier for tunnel transport. Consider a tunnel junction made of two FM metals separated by a thin AFI, as shown in FIG. 3A. When a voltage is applied across the tunnel barrier, electrons tunnel from the electrode with the lower voltage to that with the higher voltage. While the tunneling electron will relax its energy in both electrodes, the majority of the energy is relaxed in the electrode receiving the tunnel electron. Since the inelastic mean free path is only a few angstroms for the tunnel electron with the energy about 0.5 eV above the Fermi level, the heat is generated near the vicinity of the interface. The heat subsequently diffuses into the interior of the electrode as well as across the barrier. In the steady state condition, a temperature gradient is established in the structure and a temperature difference would be created at the two sides of the barrier. The temperature difference could reach a fraction of a Kelvin degree for a bias voltage of 0.5-1 V. Consequently, a magnon current would flow across the AFI barrier from one FM electrode to the other, exerting a magnon transfer torque on the free magnetization layer.

Without wishing to be bound to a particular theory or mechanism, it may be possible to recycle the wasted energy of tunnel electrons for magnetization switching. Since a magnetic barrier is required for magnon propagation, both FM and AF insulators may be barrier candidates.

Heat Transport and Temperature Profile

To model the temperature profile, examples of geometrical parameters are specified in FIG. 3A: the MTJ, comprising a pinned magnetic layer FM1, an AFI barrier, and a free magnetic layer FM2, is sandwiched by two nonmagnetic (NM) layers (representing the overlayer and underlayer of MTJs) so that the temperature profile is not simply limited within the MTJ. Thicknesses of the layers are labeled in FIG. 3B. A time-dependent electric current $j_e(t)$ flows perpendicularly to the layers with a bias voltage V(t) across the junction. The sign convention for the current is $j_e(t)<0$ (or equivalently $V(t)<0$) corresponding to net electron tunneling from FM1 to FM2. The current density used in FIG. 3B is $j_e=2\times10^6$ A cm$^{-2}$ and the voltage is V=0.2 V. Other material parameters include: $d_{FM1}=2d_{FM1}=3d_{AF1}=3$ nm, $d_N=30$ nm, $\lambda_{inel}=1$ nm, $\alpha=0.9$, $\kappa_N=401$ W m$^{-1}$ K$^{-1}$, $\kappa_{AF}=91$ W m$^{-1}$ K$^{-1}$, $\kappa_{AF}=20$ W m$^{-1}$ K$^{-1}$, $\sigma_F=1.43\times10^7$ S m$^{-1}$, and $\sigma_N=5.96\times10^7$ S m$^{-1}$. In an exemplary embodiment, the FM may be Ni, the AFI may be NiO, and the NM may be Cu. The temperatures at the outer boundaries of the MTJ may be kept at 300 K.

The heat transport can be modeled by using a layer-by-layer approach. In each layer, the heat diffusion equation reads:

$$\rho_i C_i \frac{\partial T(t,x)}{\partial t} - \kappa_i \frac{\partial^2 T(t,x)}{\partial x^2} = P_i(t,x) \quad (1)$$

where $\rho_i$, $C_i$, and $\kappa_i$ are the mass density, heat capacity, and thermal conductivity of the i$^{th}$ layer, and $P_i(t, x)$ is the power of heat source generated by the electric current. The Joule heating $j_e^2/\sigma_i$ is always present for each metallic layer where $\sigma_i$ is electric conductivity. In the tunnel junction, as illustrated in FIG. 2, the main energy relaxation of the tunnel electrons occurs near the interface. For the electrode receiving the tunnel electrons, the energy of tunnel electrons is above the Fermi level up to the bias voltage V(t). These hot electrons have short mean free paths, on the order of 1 nm. For the electrode emitting electrons, the holes left by the tunnel electrons are also short lived and thus, the annihilation of holes takes place near the interface as well.

Therefore, the heat generation by tunnel electrons may be parameterized as:

$$P_{re}(t,x) = \alpha \frac{j_e(t)V(t)}{\lambda_{inel}} \exp\exp\left(-\frac{|x|}{\lambda_{inel}}\right) \quad (2a)$$

$$P_{em}(t,x) = (1-\alpha) \frac{j_e(t)V(t)}{\lambda_{inel}} \exp\exp\left(-\frac{|x|}{\lambda_{inel}}\right) \quad (2b)$$

where |x| is the stack position from AFI/FM interface, $\alpha$ is to parametrize the relative heat power generated in two electrodes, and $\lambda_{inel}$ is the inelastic scattering mean free path. The parameter $\alpha$ is always larger than 0.5, i.e., the electron-receiving electrode generates more heat; this is because the tunnel probability is larger for tunnel electrons with higher energy.

Since the characteristic time of magnetization dynamics (about picoseconds) is much longer than the electron-electron and electron-phonon collision times (about tens of femtoseconds) which control the rate of change of the temperature, the above heat diffusion is solved in the steady state condition, i.e., the source and temperature are assumed to become constant once an electric current is turned on. Equation (1) becomes a simple differential form and the general solutions can be found for each layer. The integration constants are then determined by boundary conditions in which the continuity of the temperature and heat current across the interfaces are used.

FIG. 3B shows a temperature profile of a tunnel junction using the materials parameters in bulk form. Since an asymmetric heating parameter $\alpha=0.9$ is assumed, i.e., 90% of the Joule heating is generated at the electron receiving electrode, the temperature is always higher for the high voltage side of the junction. The temperature difference across tunnel barrier could reach tens of milli-Kelvin for a current density of $j_e=2\times10^6$ A cm$^{-2}$ and voltage of 0.2 V. The actual temperature gradient across the barrier can be even larger when the stack structure and the passivation materials used in the MTJ device are optimized.

Magnon Current and Magnon Transfer Torques

The magnon current in the presence of a temperature gradient in FM may be written as:

$$j_m^F(x) = -\hbar S_m \nabla_x T(x) \hat{M}_F - \sigma_m^F \nabla_x \mu_m(x) \hat{M}_F \quad (3)$$

where $S_m$ is the spin Seebeck coefficient, and $\sigma_m^F$ is the magnon conductivity. The effective magnon chemical potential $\mu_m(x)$ is used to describe the nonequilibrium magnon accumulation, and $\hat{M}_F$ is the FM magnetization. Within the AFI layer with two sublattices, the magnon Ohm's law is $$j_m^{AF}(x) = -\sigma_m^{AF} \nabla_x \mu_m(x) \quad (4)$$

where $\sigma_m^{AF}$ is the AFI magnon conductivity. Considering easy-axis collinear AFI, two degenerate magnon branches cancel out therefore magnon spin Seebeck effect in AFI is not considered.

The exchange interaction at AFI/FM interface is responsible for the magnon transmission:

$$H_{int} = -J_{int}\Sigma_i S_{i,F} \cdot S_{i,\alpha(b)} \quad (5)$$

where $J_{int}$ is the interface exchange constant, $S_{i,F}$ represents the spin at the interface of FM layer, and $S_{i,\alpha(b)}$ is the spin of two sublattices of AFI. Here, it is considered that (1) both FM and AFI have in-plane uniaxial anisotropy, and (2) the AFI interface is a compensated one such that the exchange coupling between the ferromagnetic spin and either sublattice spin of the AFI is modeled by the same $J_{int}$. The order parameter of AFI is assumed to have an angle to the magnetization of FM, thus the second quantization of Equation (5) would be:

$$H_{int} = -J_{int}\Sigma_{kq}(S_F S_{AF})^{1/2}[C_q A_k \alpha_q^\dagger (1+\hat{n}\cdot\hat{M}_F) + C_q A_k \beta_q^\dagger (1-\hat{n}\cdot\hat{M}_F) + H.c.]\delta_{k,q} \quad (6)$$

where n is the AFI order parameter, $A_k$ ($A_k^\dagger$) represents the annihilation (creation) operators for the FM magnons, $\alpha_q^\dagger$, $\alpha_q$ and $\beta_q^\dagger$, $\beta_q$ are the creation and annihilation operators for the two magnon branches of AFI, $C_q = u_q - v_q$ where $u_q$ and $v_q$ are the Bogoliubov transformation coefficients of AFI magnons, $S_{F(AF)}$ is the magnitude of FM (AFI) spin, and the high order magnon interactions have been neglected.

Two sets of boundary conditions at interfaces are needed to determine the integration constants from Equations (3) and (4). The first one is that the longitudinal magnon spin current is continuous across the FM/AFI interface, $$j_m^F = \hat{M}_F \cdot j_m^{AF} \quad (7)$$

and their magnitude is related to the difference of magnon chemical potential at two sides of the interface:

$$j_m = G_{A/F}^\parallel [\mu_m^F - \mu_m^{AF} \cdot \hat{M}_F] \quad (8)$$

where $G_{A/F}^\parallel$ is the longitudinal magnon spin conductance. For the $\hat{n}\cdot\hat{M}_F = 1$ case, the interface exchange interaction in the form of $J_{int} A_k \alpha_q^\dagger$ leads to a spin current across the interface. For temperature much lower than the Curie and Neel temperatures, the longitudinal magnon spin conductance scales with $$\frac{J_{int}^2}{(k_B T_C)(k_B T_N)}\left(\frac{T}{T_C}\right)^{1/2}\left(\frac{T}{T_N}\right)^2.$$

For the case in which the quantization axis of AFI is perpendicular to local magnetization of FM, e.g., $\hat{n}\cdot\hat{M}_F = 0$, both $\alpha_q$ and $\beta_q$ can create an FM magnon with the interaction $J_{int} A_k^\dagger (\alpha_q + \beta_q)$. Since $\alpha_q$ and $\beta_q$ have opposite spin direction, the nonequal accumulations of these two magnons would create a transverse spin torque on FM. The second boundary condition would be:

$$\hat{M}_F \times [\hat{M}_F \times j_m^{AF}] = -G_{A/F}^\perp \hat{M}_F \times [\hat{M}_F \times \mu_m^{AF}] \quad (9)$$

where $G_{A/F}^\perp$ is analogous to the mixing conductance and its magnitude is half the longitudinal one. After a detailed derivation (not shown), the magnon conductance is:

$$G_{AF/F}^\parallel = 2G_{AF/F}^\perp = \frac{\pi S_F S_{AF} J_{int}^2 a_F^2 a_{AF}^2}{2k_B T} \int d\varepsilon_q d\varepsilon_{q'}(u_q - v_q) \times g_m^F(\varepsilon_q) g_m^{AF}(\varepsilon_q) \times \operatorname{csch}^2 \frac{\varepsilon_q}{2k_B T} \quad (10)$$

where $a_{F(AF)}$ is the lattice constant of the FM(AFI) material and $g_m$ is the density of states of magnon. Note that the magnon current in FM layers is always parallel to the direction of the magnetization, as in the case of the electron spin current.

With these boundary conditions and the temperature profile, the magnon accumulation and magnon current can be determined in each layer. The magnon torque on the free layer FM2 was identified as the transverse component (relative to the magnetization vector of the FM2) of the magnon current at the AFI/FM2 interface.

Amplification of Spin Torques

To quantitatively estimate the enhancement of the spin torque by using an AFI barrier, the magnon current was calculated and the magnon spin torque was obtained due to the temperature difference generated by the tunnel electrons.

The critical torque, $\tau_{cr}$, for the switching of the free layer is chosen to be equivalent to the critical electric current $j_{cr}^{(0)} = 5 \times 10^6$ A cm$^{-2}$ in the absence of the magnon spin torque. When the magnon spin torque is turned on, the new critical electric current density $j_{cr}^{(m)}$ needed to generate the same amount of torque $\tau_{cr}$ is numerically determined. As the magnon torque is directly related to the Joule heating, the relative contribution between magnon current and electron spin current depends highly on the tunnel resistance. The larger the voltage (or the resistance), the greater the magnon torque relative to the electron spin torque.

FIG. 4 shows the dependence of the ratio of the switching current density with and without the magnon spin torques on the tunnel resistance area product (RA) for $\sigma = \pi/2$ (the angle between the magnetization directions of the two magnetic layers) at different interface exchange coupling strengths. It is assumed that the critical electric current $j_{cr}^{(0)} = 5 \times 10^6$ A cm$^{-2}$ with polarization P=0.5 in the absence of the magnon spin torque. The RA value scales exponentially with the barrier thickness, RA=10 μm$^2$ at $d_{AF1}$=1 nm and RA=10$^3$ μm$^2$ at $d_{AF1}$=2 nm. Other parameters used include: $d_{FM1}$=2$d_{FM2}$=3 nm, $T_C$=630K, $T_N$=530K, $a_F$=0.35 nm, $a_{AF}$=0.417 nm, $S_F$=$S_{AF}$=2. In FIG. 4, all lines represent the exact same total torque $\tau_{cr}$. As the resistance and the exchange coupling increase, the magnon spin torque increases, and thus the electric current needed to generate the same total torque reduces. Without wishing to be bound to a particular theory or mechanism, a large tunnel resistance can generate a larger magnon spin torque and therefore a thicker tunnel barrier is favored. A thick barrier thickness usually improves the tunnel magnetoresistance. However, for device applications, the tunnel resistance has to match with other parts of the electronics and thus the resistance cannot increase indefinitely.

The spin currents, or the angular momentum currents, of tunnel electrons and diffusive magnons, are not always additive. Consider the magnetization of two magnetic electrodes in parallel. If the majority electrons have a larger tunnel conductance than the minority electrons, the electron spin current would be additive to the magnon current because the spin direction of magnons is always antiparallel to the majority electrons and the flow direction of magnons from asymmetric tunneling heating is opposite to the (spin) electron current. Thus, it is essential to choose a MTJ in which majority electron tunneling dominates.

In conclusion, the present invention advantageously provides an AFI barrier-based MTJ that can achieve a significantly lower switching current density by "reuse" of the wasted energy of tunnel electrons. The advantage of using an AFI over an NM barrier is that the AFI barrier provides a magnon propagating gateway for additional spin-transfer torques created by the tunnel electrons induced thermal gradient. In some embodiments, the AFI-based MTJ may be utilized in lowering the switching current density of spin-transfer torque-based MRAMs.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the below claims are solely for ease of examination of this patent application, and are exemplary, and are not intended in any way to limit the scope of the claims to the particular features having the corresponding reference numbers in the drawings. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

What is claimed is:

1. A tunneling junction comprising:
   a. a first ferromagnetic layer having a fixed magnetization;
   b. a second ferromagnetic layer having a free magnetization; and
   c. a tunnel barrier juxtaposed between the first ferromagnetic layer and the second ferromagnetic layer, the tunnel barrier comprising an insulator layer having a magnetic order, wherein the insulator layer is magnetically uncoupled to the second ferromagnetic layer.

2. The tunneling junction of claim 1, wherein when an electric field having a low voltage at the first ferromagnetic layer and a high voltage at the second ferromagnetic layer is applied across the tunnel barrier, electrons tunnel from the first ferromagnetic layer to the second ferromagnetic layer, wherein the electrons have a spin that carries angular momentum, wherein the angular momentum generates a torque on the second ferromagnetic layer, wherein the tunneling of the electrons generates heat in the second ferromagnetic layer, wherein the heat generates a thermal gradient across the tunnel barrier, wherein the heat excites magnons that carry angular momentum, wherein the angular momentum carried by the magnons is opposite in sign to the angular momentum of the tunneling electrons,
   wherein because the tunnel barrier comprises the insulator layer with the magnetic order, the thermal gradient causes a magnon current to flow across the tunnel barrier from the second ferromagnetic layer to the first ferromagnetic layer, wherein because the magnon current carries momentum of an opposite sign, the magnon current transfers angular momentum with a sign identical to a tunnel current to the second ferromagnetic layer, wherein the angular momentum can change a magnetization direction of the second ferromagnetic layer.

3. The tunneling junction of claim 1, wherein the magnetic order of the insulator layer is antiferromagnetic, ferrimagnetic, ferromagnetic, or paramagnetic.

4. The tunneling junction of claim 3, wherein the insulator layer is antiferromagnetic below Neel temperature and paramagnetic above Neel temperature.

5. The tunneling junction of claim 4, wherein the insulator layer comprises $LaMnO_3$ or $CaMnO_3$.

6. The tunneling junction of claim 3, wherein the insulator layer is ferromagnetic below Curie temperature and paramagnetic above Curie temperature.

7. The tunneling junction of claim 6, wherein the insulator layer comprises $LaCoMnO_3$ or $LaSrMnO_3$, wherein La concentration is ⅔, and Co and Sr concentration are ⅓.

8. The tunneling junction of claim 1, wherein the insulator layer comprises $Cr_2O_3$, NiO, FeO, CoO, $BiFeO_3$, or $SrIrO_4$.

9. The tunneling junction of claim 1, wherein the insulator layer comprises Fe, Co, Ni, $Fe_3O_4$, Yttrium iron garnet (YIG), $La_{1-x}Sr_xMnO_3$, wherein x ranges from 0-1, or other transition metal oxides.

10. The tunneling junction of claim 1, wherein the insulator layer comprises a combination of ferromagnetic materials and nonmagnetic materials.

11. The tunneling junction of claim 10, wherein the nonmagnetic materials comprise Ru, Ta, Mo, W, Pt, Zr, Hf, oxides, nitrides, or combinations thereof.

12. The tunneling junction of claim 1, wherein the first ferromagnetic layer and the second ferromagnetic layer are each independently comprised of Fe, Co, Ni, $Fe_3O_4$, Yttrium iron garnet (YIG), or $La_{1-x}Sr_xMnO_3$, wherein x ranges from 0-1.

13. The tunneling junction of claim 1, wherein the first ferromagnetic layer and the second ferromagnetic layer are each independently comprised of a combination of ferromagnetic materials and nonmagnetic materials.

14. The tunneling junction of claim 1, wherein the first ferromagnetic layer and the second ferromagnetic layer are each independently comprised of alloys of $Co_xFe_yB_z$, wherein x ranges from 0-95, y ranges from 0-95, and z ranges from 0-60.

15. The tunneling junction of claim 1, further comprising a first nonmagnetic layer interfacing with one of the ferromagnetic layers.

16. The tunneling junction of claim 15 further comprising a second nonmagnetic layer interfacing with the ferromagnetic layer such that the first ferromagnetic layer, the second ferromagnetic layer, and the tunnel barrier are juxtaposed between the first nonmagnetic layer and the second nonmagnetic layer.

17. A non-volatile, magnetoresistive storage device comprising a non-volatile magneto-resistive storage element comprising a tunneling junction according to claim 1.

18. A spintronic device comprising a tunneling junction according to claim 1.

19. The spintronic device of claim 18, wherein the device is a magnetoresistive random access memory (MRAM) device, a spin logic cell, a sensor, a microwave oscillator, or an amplifier.

* * * * *